US006555439B1

United States Patent
Xiang et al.

(10) Patent No.: US 6,555,439 B1
(45) Date of Patent: Apr. 29, 2003

(54) PARTIAL RECRYSTALLIZATION OF SOURCE/DRAIN REGION BEFORE LASER THERMAL ANNEALING

(75) Inventors: Qi Xiang, San Jose, CA (US); Robert B. Ogle, San Jose, CA (US); Eric N. Paton, Morgan Hill, CA (US); Cyrus E. Tabery, Cupertino, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/021,551

(22) Filed: Dec. 18, 2001

(51) Int. Cl.[7] ................ H01L 21/00; H01L 21/336
(52) U.S. Cl. ............... 438/305; 438/308; 438/528
(58) Field of Search ......................... 438/301, 303, 438/305, 528, 308

(56) References Cited

U.S. PATENT DOCUMENTS

| | | | |
|---|---|---|---|
| 5,254,484 A | * 10/1993 | Hefner et al. | 438/373 |
| 5,602,045 A | * 2/1997 | Kimura | 257/29.04 |
| 5,908,307 A | * 6/1999 | Talwar et al. | 148/DIG. 61 |
| 5,953,615 A | * 9/1999 | Yu | 438/231 |
| 6,008,098 A | * 12/1999 | Pramanick et al. | 438/305 |
| 6,069,062 A | * 5/2000 | Downey | 438/528 |
| 6,074,937 A | * 6/2000 | Pramanick et al. | 438/301 |
| 6,251,757 B1 | * 6/2001 | Yu | 438/231 |
| 6,355,543 B1 | * 3/2002 | Yu | 438/303 |
| 6,362,063 B1 | * 3/2002 | Maszara et al. | 438/301 |
| 6,372,591 B1 | * 4/2002 | Mineji et al. | 438/305 |
| 6,391,731 B1 | * 5/2002 | Chong et al. | 438/303 |
| 6,426,278 B1 | * 7/2002 | Nowak et al. | 438/528 |

* cited by examiner

*Primary Examiner*—Richard Booth

(57) ABSTRACT

A method of manufacturing a MOSFET semiconductor device includes forming a gate electrode over a substrate and a gate oxide between the gate electrode and the substrate, forming source/drain extensions in the substrate, and forming first and second sidewall spacers. Dopants are then implanted within the substrate to form amorphitized source/drain regions in the substrate adjacent to the sidewalls spacers. The amorphitized source/drain regions are partially recrystallized, and laser thermal annealing activates the source/drain regions. The source/drain extensions and sidewall spacers are adjacent to the gate electrode. The source/drain extensions can have a depth of about 50 to 300 angstroms, and the source/drain regions can have a depth of about 400 to 1000 angstroms. Also, the recrystallization reduces the amorphitized source/drain regions by a depth of about 20 to 100 angstroms. A semiconductor device is also disclosed.

14 Claims, 4 Drawing Sheets

PARTIAL RECRYSTALLIZATION OF SOURCE/DRAIN REGION BEFORE LASER THERMAL ANNEALING

FIELD OF THE INVENTION

The present invention relates to the manufacturing of semiconductor devices, and more particularly, to laser anneal processes that minimize end-of-range defects.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS semiconductor device includes a semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS transistor is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

MOS devices typically fall in one of two groups depending on the type of dopants used to form the source, drain and channel regions. The two groups are often referred to as n-channel and p-channel devices. The type of channel is identified based on the conductivity type of the channel which is developed under the transverse electric field. In an n-channel MOS (NMOS) device, for example, the conductivity of the channel under a transverse electric field is of the conductivity type associated with n-type impurities (e.g., arsenic or phosphorous). Conversely, the channel of a p-channel MOS (PMOS) device under the transverse electric field is associated with p-type impurities (e.g., boron).

A type of device, commonly referred to as a MOS field-effect-transistor (MOSFET), includes a channel region formed in the semiconductor substrate beneath the gate area or electrode and between the source and drain regions. The channel is typically lightly doped with a dopant having a conductivity type opposite to that of the source/drain regions. The gate electrode is generally separated from the substrate by an insulating layer, typically an oxide layer such as $SiO_2$. The insulating layer is provided to prevent current from flowing between the gate electrode and the source, drain or channel regions. In operation, a voltage is typically developed between the source and drain terminals. When an input voltage is applied to the gate electrode, a transverse electric field is set up in the channel region. By varying the transverse electric field, it is possible to modulate the conductance of the channel region between the source and drain regions. In this manner an electric field is used to control the current flow through the channel region.

The semiconductor industry is continually striving to improve the performance of MOSFET devices. The ability to create devices with sub-micron features has allowed significant performance increases, for example, from decreasing performance degrading resistances and parasitic capacitances. The attainment of sub-micron features has been accomplished via advances in several semiconductor fabrication disciplines. For example, the development of more sophisticated exposure cameras in photolithography, as well as the use of more sensitive photoresist materials, have allowed sub-micron features, in photoresist layers, to be routinely achieved. Additionally, the development of more advanced dry etching tools and processes have allowed the sub-micron images in photoresist layers to be successfully transferred to underlying materials used in MOSFET structures.

As the distance between the source region and the drain region of the MOSFET (i.e., the physical channel length) decreases, in the effort to increase circuit speed and complexity, the junction depth of source/drain regions must also be reduced to prevent unwanted source/drain-to-substrate junction capacitance. However, obtaining these smaller junction depths tests the capabilities of current processing techniques, such as ion implantation with activation annealing using rapid thermal annealing. Rapid thermal annealing typically involves heating the silicon wafer, after implanting, under high-intensity heat lamps. Implanting or doping amorphitizes the silicon substrate, and the activation annealing is used to recrystallize the amorphitized silicon region.

As a result of the limitations of rapid thermal annealing, laser thermal annealing is being implemented, particularly for ultra-shallow junction depths. Laser thermal annealing may be performed after ion implantation of a dopant and involves heating the doped area with a laser. The laser radiation rapidly heats the exposed silicon such that the silicon begins to melt. The diffusivity of dopants into molten silicon is about eight orders of magnitude higher than in solid silicon. Thus, the dopants distribute almost uniformly in the molten silicon and the diffusion stops almost exactly at the liquid/solid interface. The heating of the silicon is followed by a rapid quench to solidify the silicon, and this process allows for non-equilibrium dopant activation in which the concentration of dopants within the silicon is above the solid solubility limit of silicon. Advantageously, this process allows for ultra-shallow source/drain regions that have an electrical resistance about one-tenth the resistance obtainable by conventional rapid thermal annealing.

A problem associated with source/drain regions is the formation of end-of-range defects, which are believed to stem from an interstitial-rich region proximate the lower portion of the amorphous silicon region. These interstitial-rich regions are formed during doping of the source/drain regions. Referring to FIG. 1, an amorphous silicon region 35 is formed during the doping of a silicon substrate 10 to form source/drain regions. The amorphous silicon region 35 has a lower portion characterized by an interstitial-rich region 33. After the activation anneal and upon recrystallization of surface amorphous region 35, interstitials in the interstitial-rich region 33 are believed to agglomerate, thereby generating end-of-range defects, such as dislocations and stacking faults, bordering the lower portion of surface amorphous region 35. When these end-of-range defects are present in the source/drain region, the defects disadvantageously cause junction leakage. Accordingly, a need exists for an improved laser anneal process that minimizes the effects of end-of-range defects in the source/drain region.

SUMMARY OF THE INVENTION

This and other needs are met by embodiments of the present invention which provide a method of manufacturing a semiconductor device that reduces the effects of end-of-range defects. The method comprises forming a gate electrode over a substrate and forming a gate oxide between the gate electrode and the substrate; forming source/drain extensions in the substrate; forming first and second sidewall spacers; implanting dopants within the substrate to form source/drain regions in the substrate adjacent to the sidewalls spacers; and laser thermal annealing to activate the source/drain regions. Before laser thermal annealing, the source/drains regions are partially recrystallized.

By partially recrystallizing the source/drain regions, a buffer layer is formed between the source/drain regions and end-of-range defects located at the periphery of the source/drain regions. Also, the laser thermal annealing process can melt just the amorphitized silicon and not the silicon buffer, thereby producing shallower source/drain regions than if the source/drain regions were laser thermal annealed immediately after doping. Because the end-of-range defects are no longer located in the source/drain regions, junction leakage as a result of the end-of-range defects can be reduced.

In a further aspect of the present invention, the source/drain extensions can have a depth of about 50 to 300 angstroms, and the activated source/drain regions can have a depth of about 400 to 1000 angstroms. Also, the solid phase recrystallization reduces the amorphitized source/drain regions by a depth of about 20 to 100 angstroms, and the temperature at which the solid phase recrystallization is performed is at about 550 to 700° C.

In another embodiment, a semiconductor device is disclosed that includes a substrate; a gate electrode; a gate oxide, a pair of opposing sidewall spacers, and recrystallized buffer regions. The gate oxide is formed between the gate electrode and the substrate. The pair of opposing sidewall spacers are disposed adjacent the gate electrode. The source/drain regions are formed within the substrate and uniformly have a first dopant concentration. The recrystallized buffer regions are adjacent a periphery of the source/drain regions, and the buffer regions also have a second dopant concentration different from the first dopant concentration.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention addresses and solves, at least in part, the problem of junction leakage as a result of end-of-range defects in the source/drain regions. This is achieved, in part, by partially recrystallizing the amorphitized source/drain region using solid phase epitaxy before laser thermal annealing. The end-of-range defects are located at the periphery of the amorphitized source/drain region, which is recrystallized before laser thermal annealing. Advantageously, the laser thermal annealing will melt only the amorphitized source/drain region, and not the solid phase epitaxy recrystallized region, to form the activated source/drain region. Because the end-of-range defects are located in the region recrystallized by solid phase epitaxy, the defects are not located in the activated source/drain region thereby reducing junction leakage as a result of the end-of-range defects.

An embodiment of the present invention is illustrated in FIGS. 2A–2F. A silicon substrate is provided and can be formed from any material suitable for integrated circuit manufacture. However, in one aspect, the substrate is formed from single-crystal silicon, with a <100> crystallographic orientation and which has been slightly doped with n-type or p-type impurities. Separate MOS devices are separated on the silicon substrate using isolation structures, such as a field oxide or a shallow isolation trench (not shown).

A shallow isolation trench, for example, can be formed by etching either isotropically with wet techniques or anisotropically with dry etch techniques. An oxide is thereafter deposited within the trench. As an alternative to the shallow isolation trench, a field oxide can be formed. A field oxide is typically formed via thermal oxidation in an oxygen-steam ambient at temperatures from about 850 to 1050° C. A patterned, oxidation-resistant mask can be used to prevent oxidation of non-isolation device regions. After formation of the field oxide, the mask is removed using known techniques, for example hot phosphoric acid for a silicon nitride mask or buffered hydrofluoric acid for a pad oxide mask.

Figure 1:
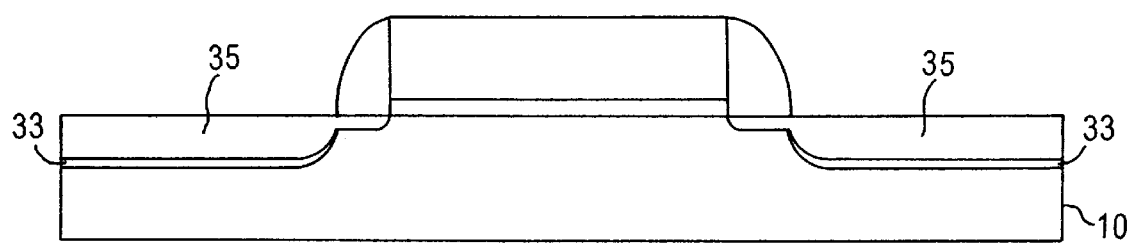
FIGS. 1 schematically illustrates end-of-range defects found in an amorphous region of a doped silicon substrate.
Figure 2A:
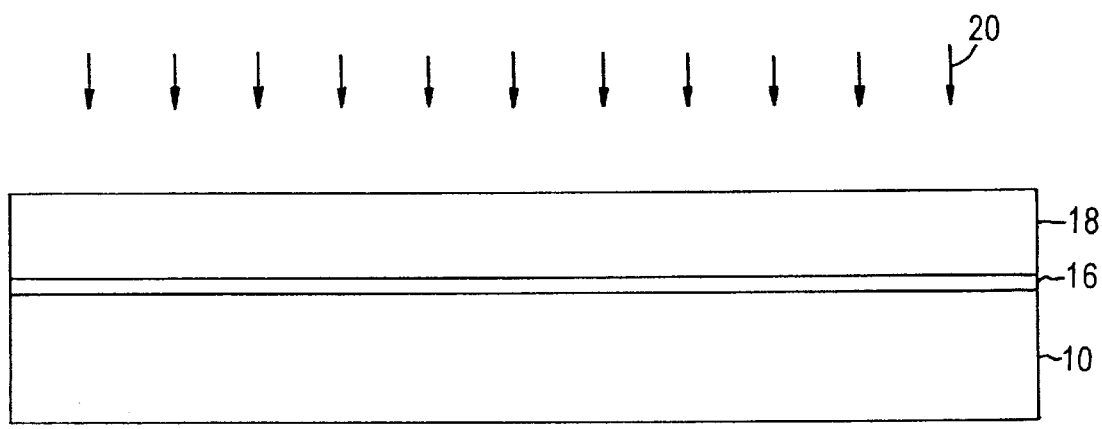
FIGS. 2A–2F schematically illustrate sequential phases of a MOS fabrication method using a laser thermal annealing process in conjunction with solid phase epitaxy according to an embodiment of the present invention.

In FIG. 2A, a gate oxide 16, comprised of silicon dioxide, is formed on the top surface of the substrate 10, for example, using thermal oxidation at temperatures from about 700 to 1000° C. in an oxygen-steam ambient. Although not limited in this manner, the gate oxide 16 can have a thickness from about 30 to 200 angstroms. After deposition of the gate oxide 16, a gate electrode is formed over the gate oxide 16.

The formation of a gate electrode typically involves depositing a blanket layer of undoped polysilicon 18, for example by low pressure chemical vapor deposition (LPCVD) at temperatures from about 600 to 800° C., on the top surface of gate oxide 16. Although not limited in this manner, the polysilicon layer 18 can have a thickness from about 500 to 5000 angstroms. The polysilicon layer 18 can then be implanted with nitrogen ions, as depicted by arrows 20. The implanted nitrogen ions, for example, can be used to retard the diffusion of boron atoms. The implantation of the nitrogen ions can be at a dosage from about $5 \times 10^{14}$ to $5 \times 10^{15}$ dopants/cm$^2$ and at an energy level from about 20 to 200 keV.

Figure 2B:
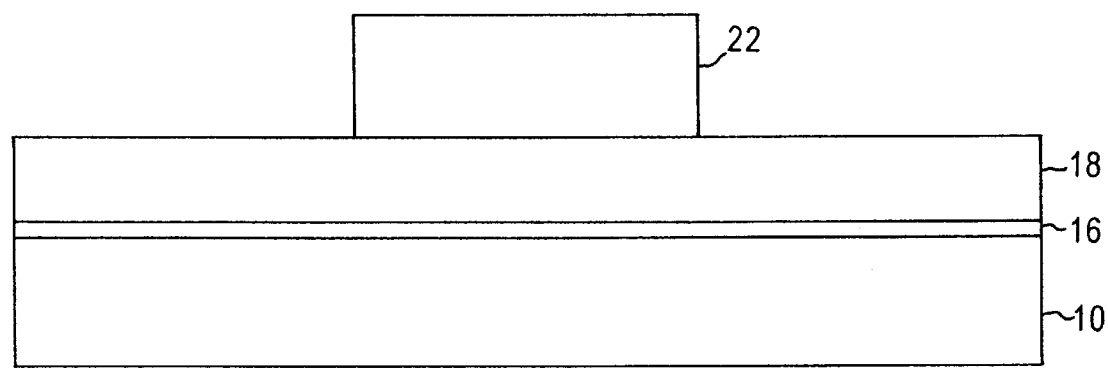

In FIG. 2B, the layers over the gate oxide 16 are etched to form the gate electrode. The etching of the gate typically involves forming a photoresist 22 on the polysilicon layer 18, and the photoresist 22 is selectively irradiated using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which will thereby define the gate electrode.

Figure 2C:
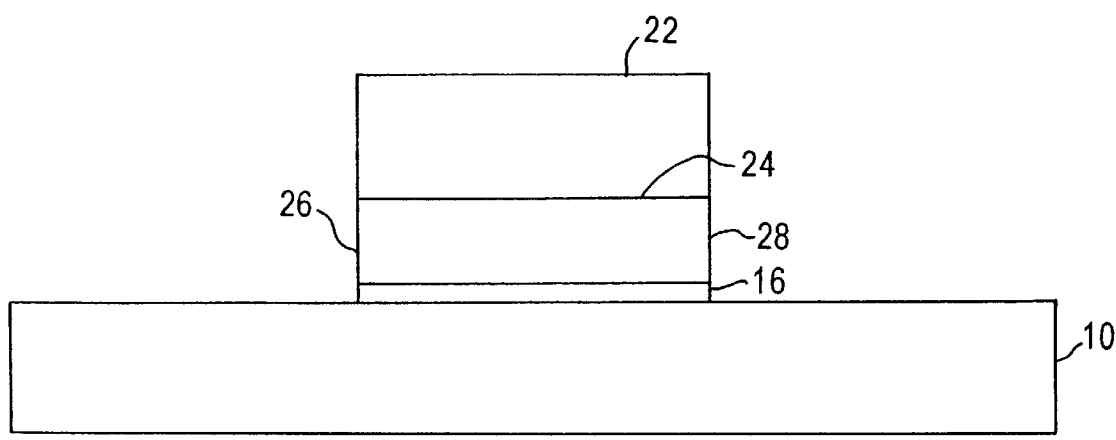

In FIG. 2C, an etch, typically anisotropic, is applied to remove the exposed portions of the polysilicon layer 18 and the underlying portions of the gate oxide 16. After etching, the remaining portion of the polysilicon layer 18 provides a gate electrode 24 having opposing vertical sidewalls 26, 28. Although not limited in this manner, the width of the gate electrode 24 between the sidewalls 26, 28 can be from about 500 to 2500 angstroms.

Figure 2D:
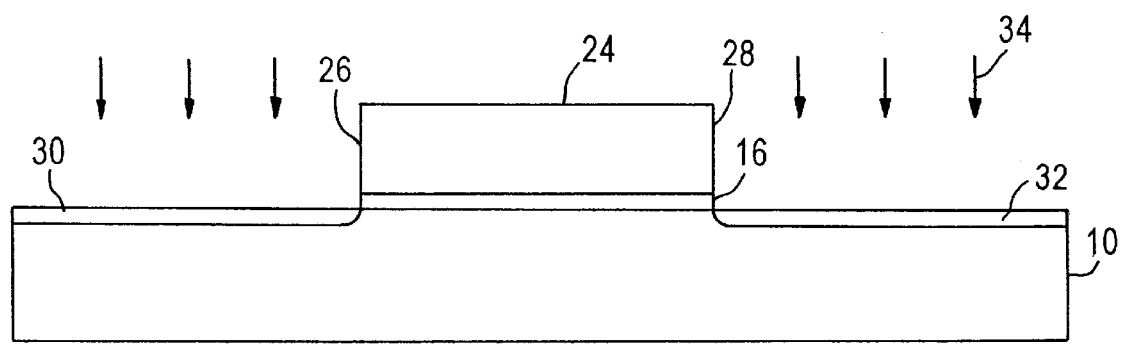

In FIG. 2D, the photoresist 22 is stripped, and lightly doped (LDD) source/drain extensions 30, 32 are formed by an ion implantation, as represented by arrows 34. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range from about 2 to 20 keV and from about $5 \times 10^{14}$ to $3 \times 10^{15}$ dopants/cm$^2$. The source/drain extensions 30, 32 are formed within the substrate 10 immediately adjacent to the sidewalls 26, 28 and are self-aligned with the gate electrode 24. After implantation, annealing is conducted to activate the source/drain extensions 30, 32 and to recrystallize the extensions. Alternatively, the annealing can occur after formation of the source/drain regions. The annealing of the source/drain extensions 30, 32 is not limited as to a particular method. For example, rapid thermal anneal or laser thermal annealing can be used. Typically, the source/drain extensions 30, 32 extend down from the surface of the silicon substrate 10 to a depth of about 50 angstroms to 300 angstroms.

Figure 2E:
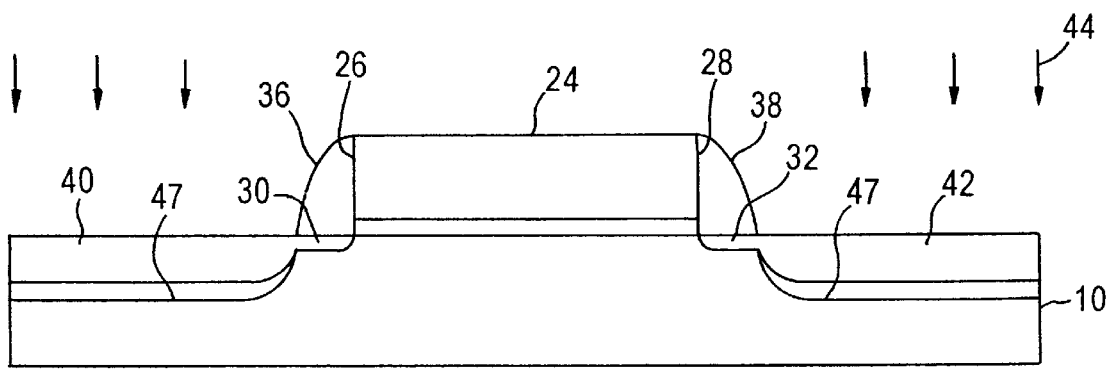

In FIG. 2E, sidewall spacers 36, 38 are formed following the implantation of the source/drain extensions 30, 32. Formation of the sidewall spacers 36, 38 involves blanket depositing a spacer material over the substrate 10. The spacer material can be silicon nitride or some other material such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation, as represented by arrows 44. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range from about 10 keV to 60 keV and from about $1 \times 10^{14}$ to $5 \times 10^{14}$ dopants/cm$^2$. The doping of the source/drain regions 40, 42 amorphitizes the silicon, which must then be recrystallized to activate the source/drain regions 40, 42.

After implantation of the source/drain regions 40, 42, the source/drain regions 40, 42 are partially recrystallized using solid phase epitaxy. Although not limited in this manner, the partial recrystallization of the amorphitized source/drain regions 40, 42 can be accomplished in a furnace from about 550° C. to about 700° C. for about 30 minutes. The recrystallization during solid phase epitaxy occurs at the periphery of the source/drain region 40, 42, which is at the boundary 47 between the crystalline substrate 10 and the amorphitized source/drain regions 40, 42. During solid phase epitaxy, the amorphous silicon uses the crystalline silicon as a template to recrystallize. Because the end-of-range defects are located proximate the initial boundary 47 between the amorphitized source/drain regions 40, 42 and the substrate 10, the recrystallization, as a result of solid phase epitaxy, forms recrystallized buffer regions 43, 45 between the source/drain regions 40, 42 and the end-of-range defects, and the recrystallized buffer regions 43, 45 may include the end-of-range defects.

The source/drain regions 40, 42 are reduced in thickness (or depth) by the thickness of the buffer regions 43, 45 that are formed, and the thickness of the buffer regions 43, 45 is not limited as to a particular amount provided that the thickness is sufficient to separate the end-of-range defects from the remaining source/drain regions 40, 42 so as to reduce junction leakage caused by the end-of-range defects. In a current aspect of the invention, the depth of the buffer regions 43, 45, and thus, the amount that the amorphitized source/drain regions 40, 42 are reduced, is between about 20 to about 100 angstroms.

The depth of the source/drain regions 40, 42 after activation is less than the depth of the source/drain regions 40, 42 after implantation because the depth of the source/drain regions 40, 42 after implantation is reduced to form the recrystallized buffer regions 43, 45. As such, it is advantageous for the source/drain regions 40, 42 to be formed with a depth greater than the source/drain regions 40, 42 would normally be formed to compensate for the reduction in depth caused by the formation of the recrystallized buffer regions 43, 45.

Figure 2F:
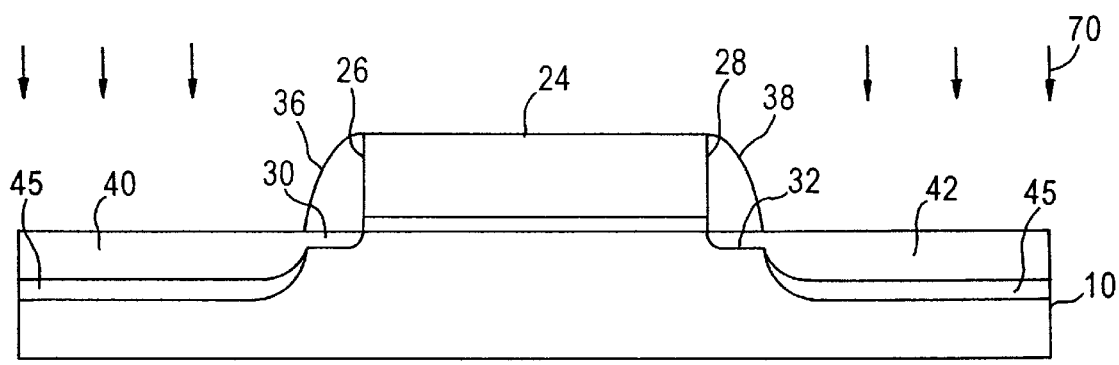

In FIG. 2F, after the partial recrystallization of the source/drain regions 40, 42, the source/drain regions 40, 42 are activated using a laser thermal annealing process. The energy from the laser, represented by arrows 70, is applied to liquefy the substrate 10 to the desired depth of source/drain regions 40, 42. An example of a laser capable of providing this energy is a spatially homogenized 308 nm XeCl pulsed laser, although the invention is not limited in this manner, and the energy and power of the laser can vary in accordance with different applications. Typically, the source/drain regions 40, 42 extend down from the surface of the silicon substrate 10 to a depth of about 400 angstroms to about 1000 angstroms.

After the silicon in source/drain regions 40, 42 has been melted, which takes approximately 30–100 nanoseconds, the silicon will cool rapidly, within about one microsecond, and the silicon will reform epitaxially. In so doing, damage caused by the implant process will be removed. The energy fluence of the laser at the surface determines the melt duration that occurs at the surface, and melt duration is related to maximum melt depth. The relationship between melt duration and maximum melt depth depends on the temporal profile of the laser beam. Precise control of junction or melt depth is possible due to the capability of measuring the full width height maximum (FWHM) of the laser and the surface melt duration during the process. Relatively large changes in the energy fluence are required to create small changes in the maximum melt depth. The total melt time can be varied by varying the number and/or energy of the laser pulses. For example, a fluence range of approximately 750 mJ/cm$^2$ to 1.3 J/cm$^2$ results in junction depths ranging from 200 angstroms to 1500 angstroms from a 308 nm excimer laser at a 9 Hz repetition rate.

The fluence range for laser irradiation can extend from about 50 mJ/cm$^2$ to about 1.3 J/cm$^2$. However, the fluence of the laser can be advantageously controlled to melt only to a depth that the silicon has been amorphitized because amorphous silicon absorbs energy at a higher rate than crystalline silicon. For example, a fluence of about 400 mJ/cm$^2$ can be used to melt amorphous silicon and not melt crystalline silicon, which in this instance is the recrystallized silicon in the recrystallized buffer regions 43, 45.

By melting the amorphitized silicon and not the silicon buffer regions 43, 45 recrystallized by solid phase epitaxy, the source/drain regions 40, 42 can be made shallower than if the source/drain regions 40, 42 were laser thermal annealed immediately after doping. Importantly, the location of the end-of-range defects remains the same regardless of whether laser thermal annealing or rapid thermal annealing is used, and this location is proximate the initial boundary 47 between the amorphitized source/drain regions 40, 42 and the substrate 10. However, by partial recrystallizing part of the amorphous region using solid phase epitaxy before laser thermal annealing, recrystallized buffer regions 43, 45 can be provided between the activated source/drain regions 40, 42 and the end-of-range defects. As the end-of-range defects are no longer located in the source/drain regions 40, 42, the risk of junction leakage as a result of the end-of-range defects is reduced.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A method of manufacturing a semiconductor device, comprising the steps of:
    forming a gate electrode over a substrate;
    implanting dopants within the substrate to form amorphitized source/drain regions in the substrate proximate to the gate electrode;
    recrystallizing a portion of the amorphitized source/drain regions to form recrystallized source/drain regions and remaining amorphitized source/drain regions; and
    activating the remaining amorphitized source/drain regions by laser thermal annealing.

2. The method of manufacturing a semiconductor device according to claim 1, wherein the portion of the source/drain regions are recrystallized using solid phase epitaxy.

3. The method of manufacturing a semiconductor device according to claim 2, wherein the solid phase epitaxy is performed in a furnace at about 550 to 700° C.

4. The method of manufacturing a semiconductor device according to claim 1, wherein the recrystallization occurs at a periphery of the amorphitized source/drain regions.

5. The method of manufacturing a semiconductor device according to claim 1, wherein the recrystallized source/drain regions is between the amorphitized source/drain regions and end-of-range defects associated with the amorphitized source/drain regions.

6. The method of manufacturing a semiconductor device according to claim 1, further comprising the steps of forming source/drain extensions in the substrate adjacent to the gate electrode and forming sidewall spacers adjacent to the gate electrode.

7. The method of manufacturing a semiconductor device according to claim 6, wherein the source/drain extensions have a depth of about 50 to 300 angstroms.

8. The method of manufacturing a semiconductor device according to claim 1, wherein the source/drain regions have a depth of about 400 to 1000 angstroms after the laser thermal annealing.

9. The method of manufacturing a semiconductor device according to claim 1, wherein the recrystallization reduces a depth of the amorphitized source/drain regions by about 20 to 100 angstroms.

10. The method of manufacturing a semiconductor device according to claim 1, wherein said step of activating the source/drain regions by laser thermal annealing melts the amorphitized source/drain regions and does not melt the recrystallized source/drain regions.

11. The method of manufacturing a semiconductor device according to claim 1, wherein the semiconductor device is a MOSFET.

12. A method of manufacturing a MOSFET semiconductor device, comprising the steps of:
    forming a gate electrode over a substrate;
    forming source/drain extensions in the substrate adjacent to the gate electrode;
    forming first and second sidewall spacers adjacent to the gate electrode;
    implanting dopants within the substrate to form amorphitized source/drain regions in the substrate adjacent to the sidewall spacers;
    recrystallizing a portion of the amorphitized source/drain region using solid phase epitaxy to form recrystallized buffer regions and remaining amorphitized source/drain regions; and;
    activating the amorphitized source/drain regions using laser thermal annealing to melt the amorphitized source/drain region and not melt the buffer regions,
    wherein the activated source/drain regions have a depth of about 400 to 1000 angstroms.

13. The method of manufacturing a semiconductor device according to claim 12, a depth of the recrystallized buffer regions is about 20 to 100 angstroms.

14. The method of manufacturing a semiconductor device according to claim 12, wherein a concentration of end-of-range defects in said buffer regions is higher than a concentration of end-of-range defects in said source/drain regions.

* * * * *